United States Patent [19]
Fujita

[11] Patent Number: 6,111,810
[45] Date of Patent: Aug. 29, 2000

[54] SYNCHRONOUS SEMICONDUCTOR MEMORY DEVICE HAVING BURST ACCESS MODE AND MULTI-BIT PRE-FETCH OPERATION

[75] Inventor: Mamoru Fujita, Tokyo, Japan

[73] Assignee: NEC Corporation, Tokyo, Japan

[21] Appl. No.: 09/409,695

[22] Filed: Sep. 30, 1999

[30] Foreign Application Priority Data

Sep. 30, 1998 [JP] Japan ................................. 10-276924

[51] Int. Cl.⁷ ...................................................... G11C 8/10
[52] U.S. Cl. ................... 365/230.06; 365/233; 365/236; 365/230.08; 365/230.03
[58] Field of Search .............................. 365/230.06, 233, 365/236, 230.08, 230.03

[56] References Cited

U.S. PATENT DOCUMENTS

| | | |
|---|---|---|
| 5,548,560 | 8/1996 | Stephens, Jr. et al. .............. 365/233.5 |
| 5,559,752 | 9/1996 | Stephens, Jr. et al. .................. 365/233 |
| 5,983,314 | 11/1999 | Merritt .................................... 365/233 |
| 5,991,226 | 11/1999 | Bhullar .............................. 365/230.08 |
| 5,991,227 | 11/1999 | Park .................................. 365/230.08 |

*Primary Examiner*—Andrew Q. Tran

[57] ABSTRACT

The present invention provides a synchronous memory device having at least a multi-bit pre-fetch address generator circuit, and at least an access path which includes at least a command decoder having an output terminal connected to at least a follower circuit element which receives a command signal from the at least a command decoder, wherein the at least a multi-bit pre-fetch address generator circuit is connected to the at least a follower circuit element in parallel to the at least a command decoder, so that the at least a multi-bit pre-fetch address generator circuit is excluded from a transmission path of the command signal, whereby the at least a multi-bit pre-fetch address generator circuit generates a plurality of internal address signals independently from transmission of the command signal from the at least a command decoder to the at least a follower circuit element.

11 Claims, 10 Drawing Sheets

SYNCHRONOUS SEMICONDUCTOR MEMORY DEVICE HAVING BURST ACCESS MODE AND MULTI-BIT PRE-FETCH OPERATION

BACKGROUND OF THE INVENTION

The present invention relates to a semiconductor memory device, and more particularly to a semiconductor memory device with burst access mode.

A computer main memory device performs input/output operations for inputting and outputting a column of data with continuous address for cache memory in synchronizing with reference clock signals having externally entered. This data transmission is so called as burst transmission. A length of data column to be inputted or outputted in correspondence with a single designated address is so called to be burst length. A synchronous dynamic random access memory device is one of the typical memory devices which exhibit burst transmissions.

FIG. 1 is a block diagram illustrative of a conventional synchronous dynamic random access memory. FIG. 2 is a timing chart of the conventional synchronous dynamic random access memory shown in FIG. 1. Upon input of read/write commands into a command decoder 30, an external address is transmitted from the command decoder 30 into a burst counter 31, so that, in accordance with both a burst length signal having already set therein and the fetched external address signal, a single internal address is generated by the burst counter 31. Subsequently, this generated single internal address is sent from the burst counter 31 to a multi-bit pre-fetch address generator circuit 32, so that the multi-bit pre-fetch address generator circuit 32 generates plural internal addresses in accordance with the single internal address. Those plural internal addresses are individually sent from the multi-bit pre-fetch address generator circuit 32 to a plurality of internal address driver circuits 34 and 35. The individual internal address driver circuits 34 and 35 are connected to corresponding plural memory cell arrays 36 and 37. For example, the internal address driver circuit 34 is connected to the memory cell array 36, and the internal address driver circuit 35 is connected to the memory cell array 37, so that the individual memory cell arrays 36 and 37 are separately driven in data input/output operations by the corresponding internal address driver circuits 34 and 35. Thereafter, during a time period of predetermined number cycles, the burst counter 31 remains operated to generate fresh internal addresses so that the data input/output operations to the plural memory cell arrays are successively conducted.

Recently, the requirement for further increase in operational speed of the synchronous dynamic random access memory has been on the increase. The above conventional synchronous dynamic random access memory has the limit of its high speed performance. After the read/write commands have been processed by the burst counter 31 to have generated the single internal address, then the multi-bit pre-fetch address generator circuit 32 receives the single internal address from the burst counter 31 and generate plural internal addresses for multi-bit pre-fetch operations before the individual internal address driver circuits 34 and 35 receive the corresponding internal addresses for individually and separately driving the corresponding memory cell arrays 36 and 37. This those purposes, the multi-bit pre-fetch address generator circuit 32 is connected between the burst counter 31 and the plural internal address driver circuits 34 and 35. This conventional circuit configuration causes a reduction in read/write operation speed of the synchronous dynamic random access memory. Namely, an access path of the conventional circuit configuration is so long as causing reduction in read/write operation speed because the access path has many circuit elements, for example, command latches 38, the command decoder 30, the burst counter 31, the multi-bit pre-fetch address generator circuit 32, the internal address driver circuits 34 and 35, and the memory cell arrays 36 and 37.

In the above circumstances, it had been required to develop a novel semiconductor memory device with the burst access mode and the multi-bit pre-fetch operations free from the above problem.

SUMMARY OF THE INVENTION

Accordingly, it is an object of the present invention to provide a novel semiconductor memory device with the burst access mode and the multi-bit pre-fetch operations free from the above problems.

It is a further object of the present invention to provide a novel semiconductor memory device with the burst access mode and the multi-bit pre-fetch operations, which exhibits an improved high speed read/write operation.

It is a still further object of the present invention to provide a novel semiconductor memory device with the burst access mode and the multi-bit pre-fetch operations, which has a shortened access path for improvement in high speed performance in data read/write operations.

It is yet a further object of the present invention to provide a novel semiconductor memory device with the burst access mode and the multi-bit pre-fetch operations, which has a shortened access path independent from a multi-bit pre-fetch address generator circuit for improvement in high speed read/write operation.

The present invention provides a synchronous memory device having at least a multi-bit pre-fetch address generator circuit, and at least an access path which includes at least a command decoder having an output terminal connected to at least a follower circuit element which receives a command signal from said at least a command decoder, wherein said at least a multi-bit pre-fetch address generator circuit is connected to said at least a follower circuit element in parallel to said at least a command decoder, so that said at least a multi-bit pre-fetch address generator circuit is excluded from a transmission path of said command signal, whereby said at least a multi-bit pre-fetch address generator circuit generates a plurality of internal address signals independently from transmission of said command signal from said at least a command decoder to said at least a follower circuit element.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
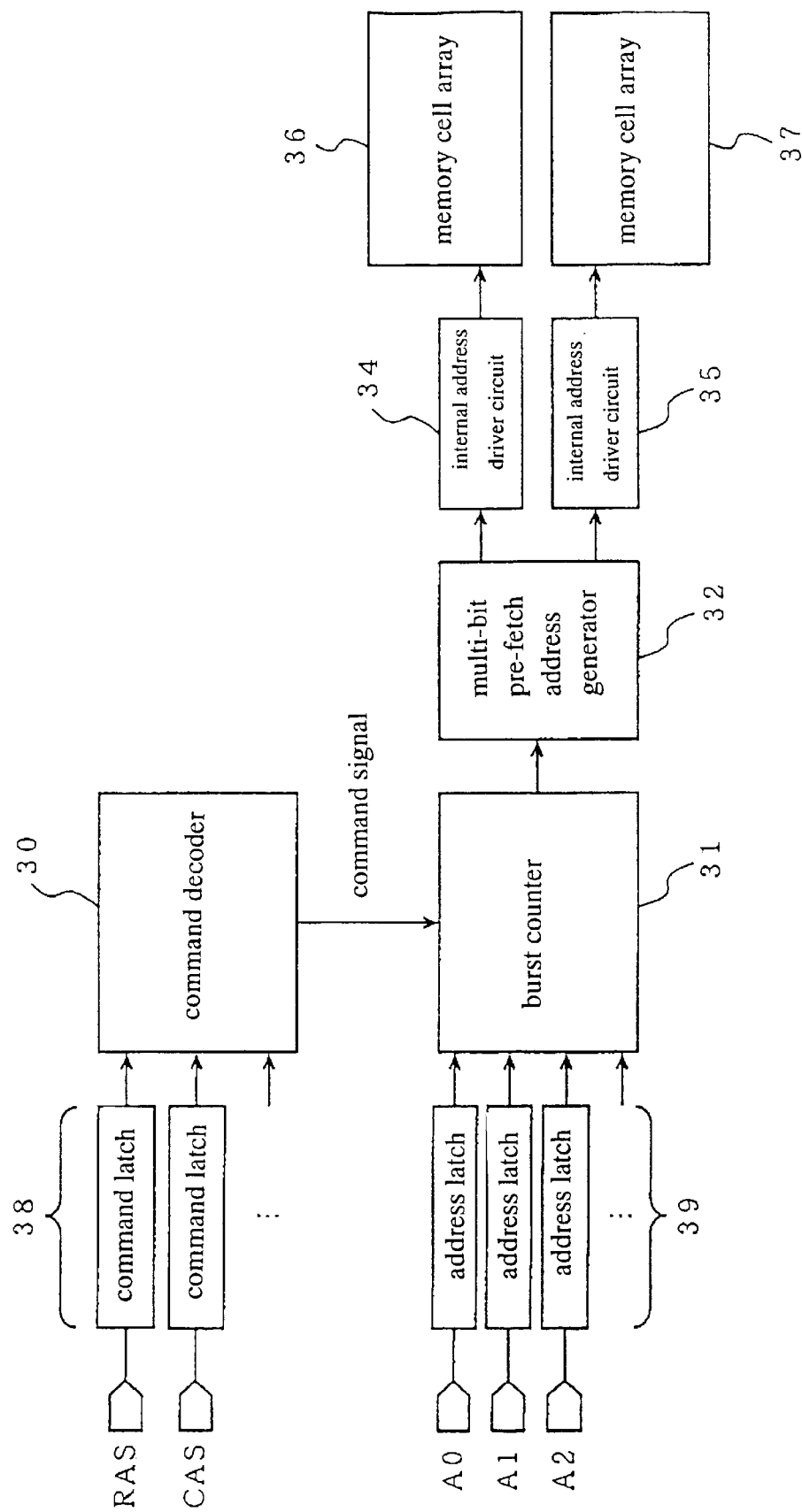
FIG. 1 is a block diagram illustrative of a conventional synchronous dynamic random access memory.
Figure 2:
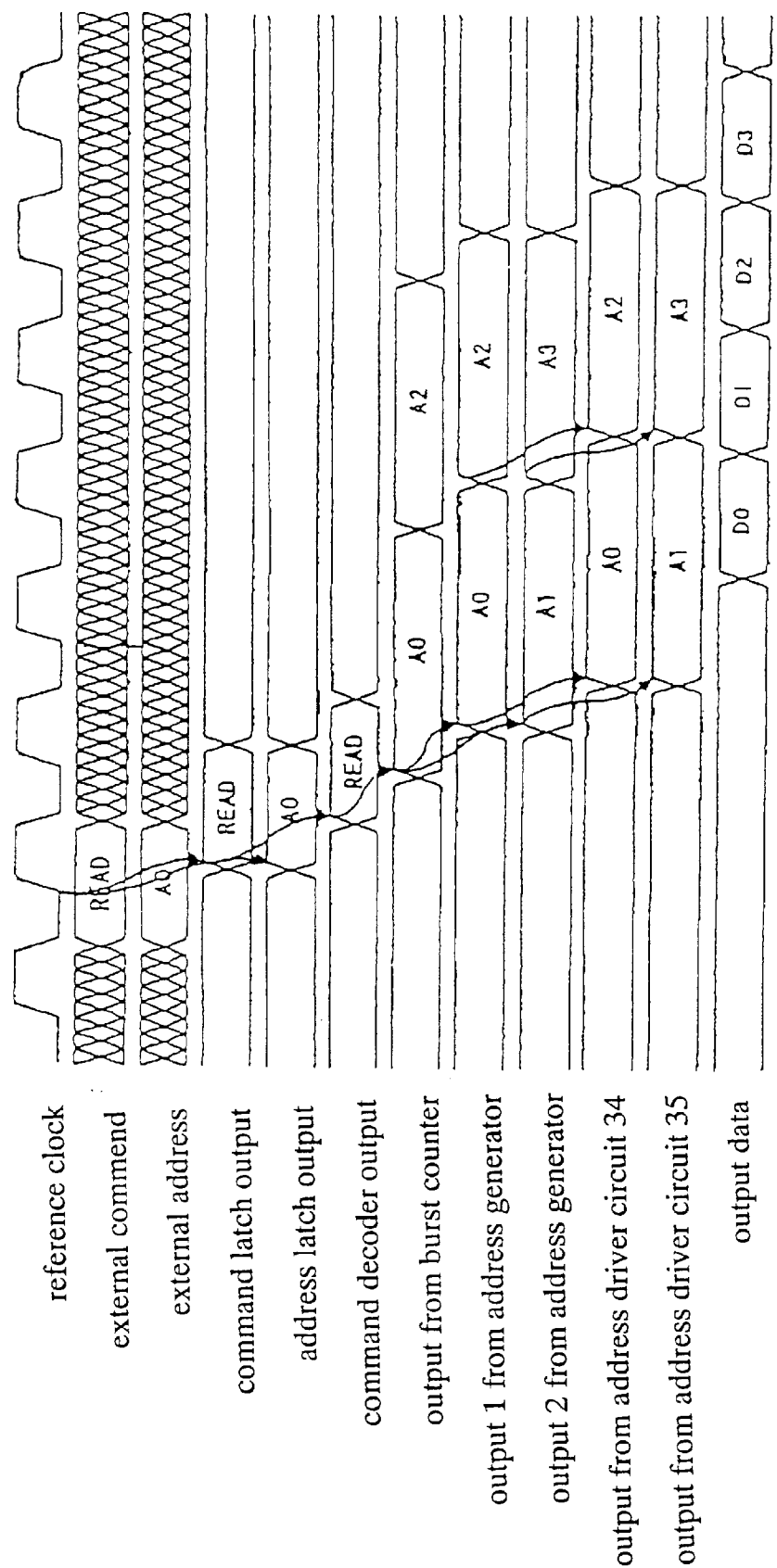
FIG. 2 is a timing chart of the conventional synchronous dynamic random access memory shown in FIG. 1.

The present invention provides a circuit connection structure of at least a multi-bit pre-fetch address generator circuit to at least an access path of a synchronous memory device, and said at least an access path includes at least a command decoder having an output terminal connected to at least a follower circuit element which receives a command signal from said at least a command decoder, wherein said at least a multi-bit pre-fetch address generator circuit is connected to said at least a follower circuit element in parallel to said at least a command decoder, so that said at least a multi-bit pre-fetch address generator circuit is excluded from a transmission path of said command signal, whereby said at least a multi-bit pre-fetch address generator circuit generates a plurality of internal address signals independently from transmission of said command signal from said at least a command decoder to said at least a follower circuit element.

It is preferable that said at least a multi-bit pre-fetch address generator circuit comprises a single multi-bit pre-fetch address generator circuit, and said at least a follower circuit element comprises a plurality of burst counters.

It is further preferable that said at least an access path comprises a single access path which comprises; command latch circuits; a command decoder connected to said command latch circuits; said plurality of burst counters respectively connected to said command decoder; a plurality of internal address driver circuits individually connected to corresponding ones of said plurality of burst counters; and a plurality of memory cell arrays individually connected to corresponding ones of said plurality of internal address driver circuits, and that said single multi-bit pre-fetch address generator circuit is connected to said plurality of burst counters respectively.

It is also preferable that said at least a multi-bit pre-fetch address generator circuit comprises a plurality of multi-bit pre-fetch address generator circuits, and said at least an access path comprises a plurality of access paths, so that at least one of said plurality of multi-bit pre-fetch address generator circuits is excluded from at least one of said plurality of access paths, and the remaining of said plurality of multi-bit pre-fetch address generator circuits is included in the remaining of said plurality of access paths.

It is further preferable that said plurality of access paths comprise first and second access paths and said plurality of said multi-bit pre-fetch address generator circuits comprise first and second multi-bit pre-fetch address generator circuits, and said first access path comprises: command latch circuits; a command decoder connected to said command latch circuits; a plurality of internal address driver circuits connected to said command decoder; a plurality of memory cell arrays individually connected to corresponding ones of said plurality of internal address driver circuits, and further preferable that that said second access path comprises: said command latch circuits; said command decoder connected to said command latch circuits; a single burst counter connected to said command decoder and also connected to address latch circuits; said second multi-bit pre-fetch address generator circuit connected to said single burst counter; said plurality of internal address driver circuits connected to said second multi-bit pre-fetch address generator circuit; said plurality of memory cell arrays individually connected to corresponding ones of said plurality of internal address driver circuits, and further preferable that said first multi-bit pre-fetch address generator circuit is connected to each of said plurality of internal address driver circuits.

The above first present invention is applicable to any types of synchronous memory devices.

The second present invention provides a synchronous memory device having at least a multi-bit pre-fetch address generator circuit, and at least an access path which includes at least a command decoder having an output terminal connected to at least a follower circuit element which receives a command signal from said at least a command decoder, wherein said at least a multi-bit pre-fetch address generator circuit is connected to said at least a follower circuit element in parallel to said at least a command decoder, so that said at least a multi-bit pre-fetch address generator circuit is excluded from a transmission path of said command signal, whereby said at least a multi-bit pre-fetch address generator circuit generates a plurality of internal address signals independently from transmission of said command signal from said at least a command decoder to said at least a follower circuit element.

It is preferable that said at least a multi-bit pre-fetch address generator circuit comprises a single multi-bit pre-fetch address generator circuit, and said at least a follower circuit element comprises a plurality of burst counters.

It is further preferable that said at least an access path comprises a single access path which comprises: command latch circuits; a command decoder connected to said command latch circuits; said plurality of burst counters respectively connected to said command decoder; a plurality of internal address driver circuits individually connected to corresponding ones of said plurality of burst counters; and a plurality of memory cell arrays individually connected to corresponding ones of said plurality of internal address driver circuits, and wherein said single multi-bit pre-fetch address generator circuit is connected to said plurality of burst counters respectively.

It is also preferable that said at least a multi-bit pre-fetch address generator circuit comprises a plurality of multi-bit pre-fetch address generator circuits, and said at least an access path comprises a plurality of access paths, so that at least one of said plurality of multi-bit pre-fetch address generator circuits is excluded from at least one of said plurality of access paths, and the remaining of said plurality of multi-bit pre-fetch address generator circuits is included in the remaining of said plurality of access paths.

It is farther preferable that said plurality of access paths comprise first and second access paths and said plurality of said multi-bit pre-fetch address generator circuits comprise first and second multi-bit pre-fetch address generator circuits, and said first access path comprises: command latch circuits; a command decoder connected to said command latch circuits; a plurality of internal address driver circuits connected to said command decoder; a plurality of memory cell arrays individually connected to corresponding ones of said plurality of internal address driver circuits, and also preferable that said second access path comprises; said command latch circuits; said command decoder connected to said command latch circuits; a single burst counter connected to said command decoder and also connected to address latch circuits; said second multi-bit pre-fetch address generator circuit connected to said single burst counter; said plurality of internal address driver circuits connected to said second multi-bit pre-fetch address generator circuit; said plurality of memory cell arrays individually connected to corresponding ones of said plurality of internal address driver circuits, and wherein said first multi-bit pre-fetch address generator circuit is connected to each of said plurality of internal address driver circuits.

PREFERRED EMBODIMENTS

Figure 3:
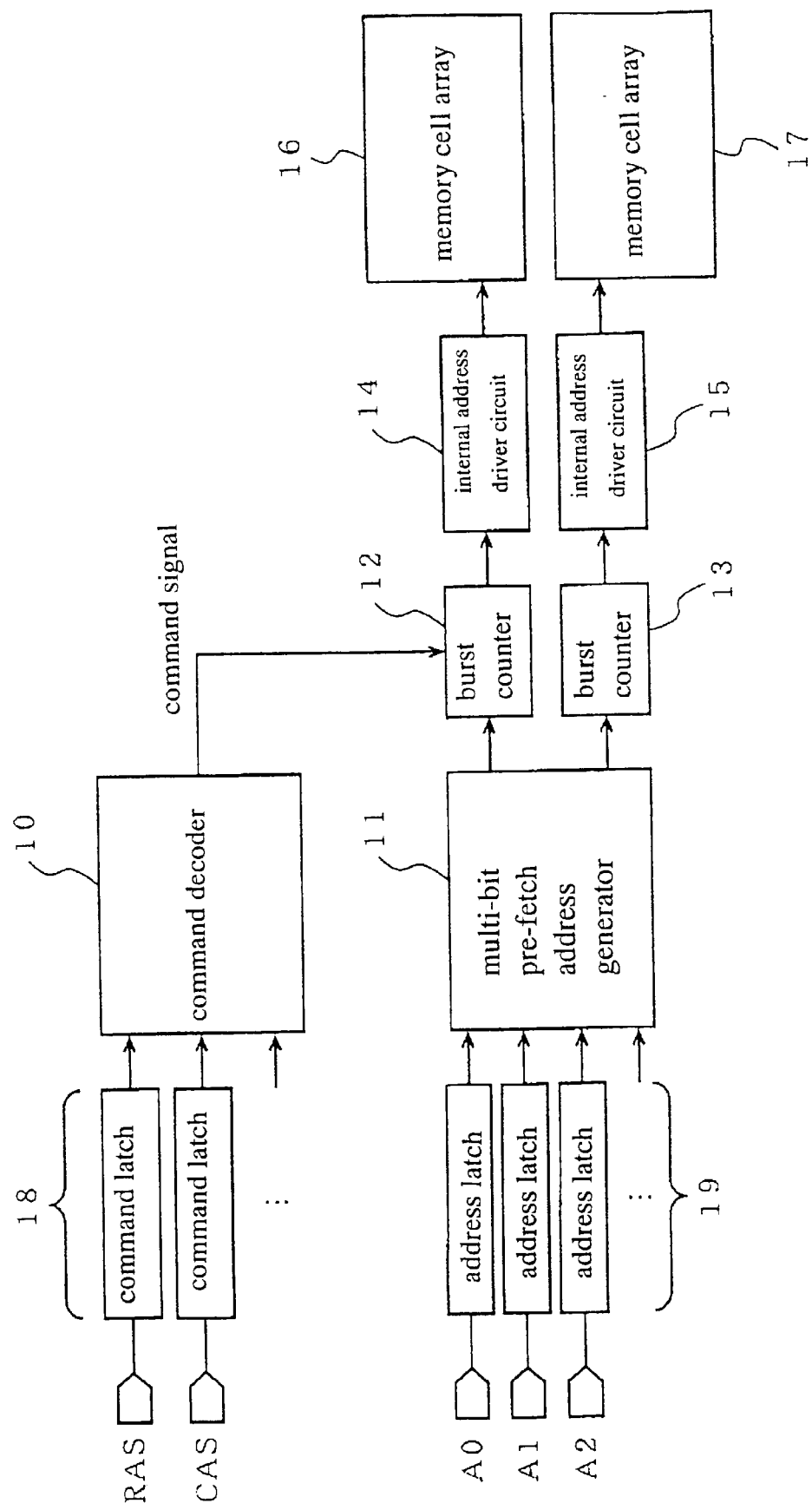
FIG. 3 is a block diagram illustrative of a first novel circuit configuration of a novel synchronous dynamic random access memory in a first embodiment in accordance with the present invention.

A first embodiment according to the present invention will be described in detail with reference to the drawings. FIG. 3 is a block diagram illustrative of a first novel circuit configuration of a novel synchronous dynamic random access memory in a first embodiment in accordance with the present invention. The synchronous dynamic random access memory has a plurality of command latches 18, a plurality of address latches 19, a command decoder 10 connected to the command latches 18, a multi-bit pre-fetch address generator circuit 11 connected to the address latches 19, a plurality of burst counters 12 and 13 connected to the command decoder 10 and also connected to the multi-bit pre-fetch address generator circuit 11, a plurality of internal address driver circuits 14 and 15 which are connected to the burst counters 12 and 13 respectively, and memory cell arrays 16 and 17 connected to the internal address driver circuits 14 and 15 respectively.

Figure 7:
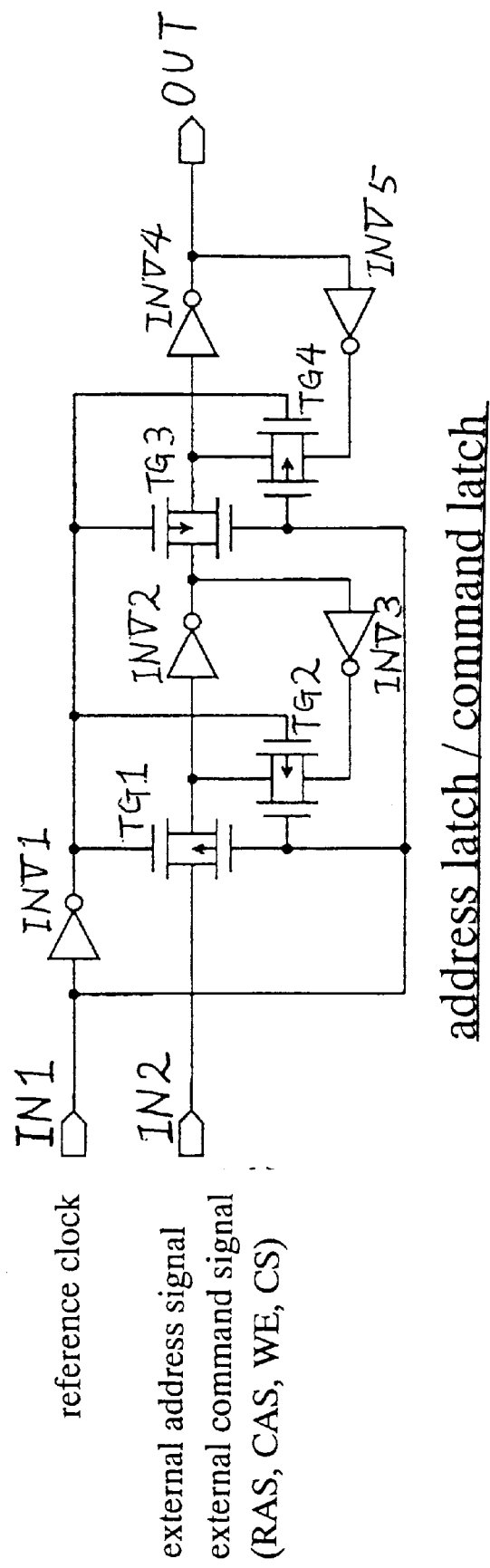
FIG. 7 is a circuit diagram illustrative of an available circuit configuration of the latch circuit for either the command latches 18 and the address latches 19.

The command latches 18 are operated to latch external command signals RAS, CAS, WE, and CS. The address latches 19 are operated to latch external address signals A0, A1 and A2. The command latches 18 and the address latches 19 may comprise latch circuits having the same circuit configuration. FIG. 7 is a circuit diagram illustrative of an available circuit configuration of the latch circuit for either the command latches 18 and the address latches 19. The latch circuit has two input terminals IN1 and IN2 and a single output terminal OUT. The first input terminal IN1 is provided to receive an input of a reference clock signal. The second input terminal IN2 is provided to receive an input of an external address signal if this latch circuit is used as the address latch 19, or to receive an input of an external command signal if this latch circuit is used as the command latch 18. The latch circuit comprises five inverters INV1, INV2, INV3, INV4 and INV5 and four transmission gates TG1, RG2, TG3 and TG4. The first inverter INV1 is provided which has an input side connected to the first input terminal IN1 receiving the reference clock signal. The first transmission gate TG1 is provided which has a first gate terminal connected to an output side of the first inverter INV1 and a second gate terminal connected to the input side of the first inverter INV1. The first transmission gate TG1 also has an input side connected to the second input terminal IN2 receiving the external address signal or the external command signal, and an output side connected to an input side of the second inverter INV2. The second transmission gate TG2 is provided which has a first gate terminal connected to the input side of the first inverter INV1 and a second gate terminal connected to the output side of the first inverter INV1. The second transmission gate TG2 also has an input side connected to an output side of the third inverter INV3, and an output side connected to the input side of the second inverter INV2 The third transmission gate TG3 is provided which has a first gate terminal connected to the input side of the first inverter INV1 and a second gate terminal connected to the output side of the first inverter INV1. The third transmission gate TG3 also has an input side connected to an output side of the second inverter INV2 and also connected to the input side of the third inverter INV3, and an output side connected to an input side of the fourth inverter INV4. The fourth transmission gate TG4 is provided which has a first gate terminal connected to the output side of the first inverter INV1 and a second gate terminal connected to the input side of the first inverter INV1. The fourth transmission gate TG4 also has an input side connected to an output side of the fifth inverter INV5, and an output side connected to the input side of the fourth inverter INV4 and also connected to the output side of the third transmission gate TG3. The fourth inverter INV4 has an input side connected to the output sides of the third and fourth transmission gates TG3 and TG4, and an output side connected to the output terminal OUT of the latch circuit. The fifth inverter INV5 has an input side connected to the output terminal OUT of the latch circuit, and an output side connected to the input sides of the fourth transmission gate TG4. The first transmission gate TG1 receives the reference clock signal as the second gate control signal and the inverted reference clock signal as the first gate control signal. The second transmission gate TG2 receives the reference clock signal as the first gate control signal and the inverted reference clock signal as the second gate control signal. The third transmission gate TG3 receives the reference clock signal as the first gate control signal and the inverted reference clock signal as the second gate control signal. The fourth transmission gate TG4 receives the reference clock signal as the second gate control signal and the inverted reference clock signal as the first gate control signal. The external address signal or the external command signal as inputted into the second input terminal IN2 of the latch circuit is transmitted through the first transmission gate TG1, the second inverter INV2, the third transmission gate TG3 and the fourth inverter INV4 to the output terminal OUT of the latch circuit.

Figure 8:
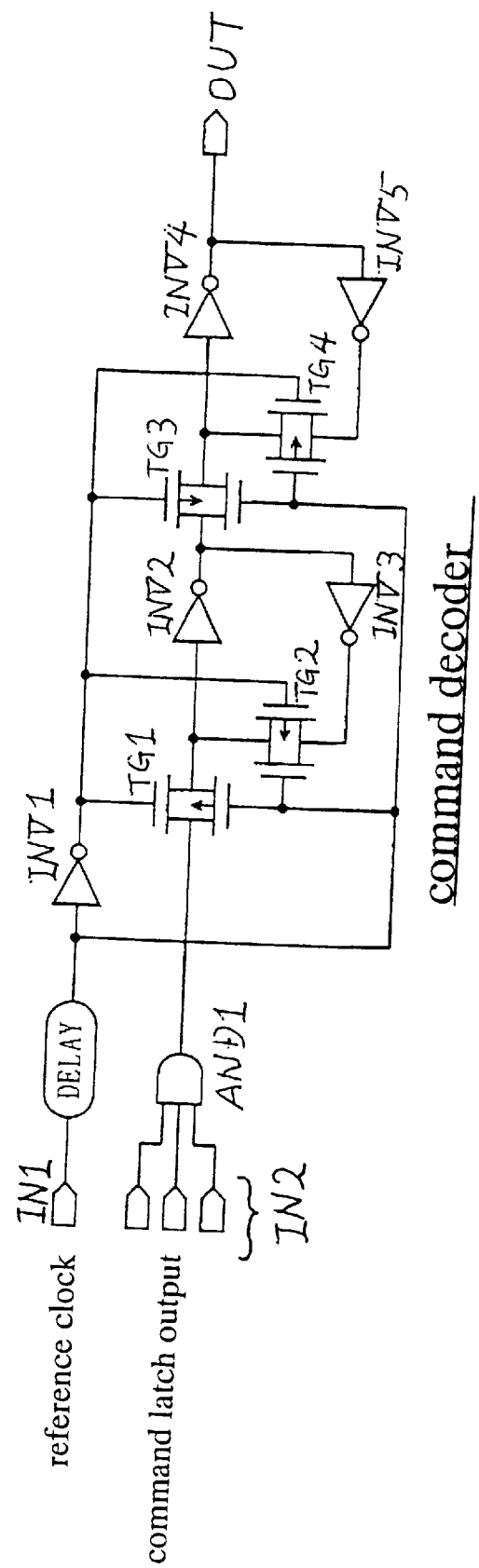
FIG. 8 is a circuit diagram illustrative of an available circuit configuration of the command decoder circuit in the synchronous dynamic random access memory with the burst access mode shown in FIG. 3.

The command decoder 10 is operated to fetch external command signals RAS, CAS, WE, and CS in synchronizing with the reference clock signal in order to decode the external command signals RAS, CAS, WE, and CS and to generate internal command signals respectively corresponding to the external command signals. FIG. 8 is a circuit diagram illustrative of an available circuit configuration of the command decoder circuit 10. The decoder circuit has two input terminals IN1 and IN2 and a single output terminal OUT. The first input terminal IN1 is provided to receive an input of a reference clock signal. The second input terminals IN2 are connected to the plural command latch circuits 18 or receiving command latch outputs from the plural command latch circuits 18. The decoder circuit comprises five inverters INV1, INV2, INV3, INV4 and INV5 and four transmission gates TG1, RG2, TG3 and TG4, and further a single delay circuit DELAY and a single AND gate AND1. The delay circuit is provided which has an input side connected to the first input terminal IN1 of the decoder circuit for receiving the reference clock signal. The AND gate is provided which has input terminals respectively connected to the second input terminals IN2 receiving the command latch outputs from the command latch circuits 18. The first inverter INV1 is provided which has an input side connected to an output side of the delay circuit DELAY for receiving the delayed reference clock signal from the delay circuit DELAY. The first transmission gate TG1 is provided which has a first gate terminal connected to an output side of the first inverter INV1 and a second gate terminal connected to the input side of the first inverter INV1. The first transmission gate TG1 also has an input side connected to an output terminal of the AND gate AND1 from an AND signal from the AND gate AND1, and an output side connected to an input side of the second inverter INV2. The second transmission gate TG2 is provided which has a first gate terminal connected to the input side of the first inverter INV1 and a second gate terminal connected to the output side of the first inverter INV1. The second transmission gate TG2 also has an input side connected to an output side of the third inverter INV3, and an output side connected to the input side of the second inverter INV2. The third transmission gate TG3 is provided which has a first gate terminal connected to the input side of the first inverter INV1 and a second gate terminal connected to the output side of the first inverter INV1. The third transmission gate TG3 also has an input side connected to an output side of the second inverter INV2 and also connected to the input side of the third inverter INV3, and an output side connected to an input side of the fourth inverter INV4. The fourth transmission gate TG4 is provided which has a first gate terminal connected to the output side of the first inverter INV1 and a second gate terminal connected to the input side of the first inverter INV1. The fourth transmission gate TG4 also has an input side connected to an output side of the fifth inverter INV5, and an output side connected to the input side of the fourth inverter INV4 and also connected to the output side of the third transmission gate TG3. The fourth inverter INV4 has an input side connected to the output sides of the third and fourth transmission gates TG3 and TG4, and an output side connected to the output terminal OUT of the decoder circuit. The fifth inverter INV5 has an input side connected to the output terminal OUT of the decoder circuit, and an output side connected to the input sides of the fourth transmission gate TG4. The first transmission gate TG1 receives the delay reference clock signal as the second gate control signal and the inverted delay reference clock signal as the first gate control signal. The second transmission gate TG2 receives the delay reference clock signal as the first gate control signal and the inverted delay reference clock signal as the second gate control signal. The third transmission gate TG3 receives the delay reference clock signal as the first gate control signal and the inverted delay reference clock signal as the second gate control signal, The fourth transmission gate TG4 receives the delay reference clock signal as the second gate control signal and the inverted delay reference clock signal as the first gate control signal. The logical product of the command latch outputs is transmitted through the first transmission gate TG1, the second inverter INV2, the third transmission gate TG3 and the fourth inverter INV4 to the output terminal OUT of the decoder circuit.

Figure 9:
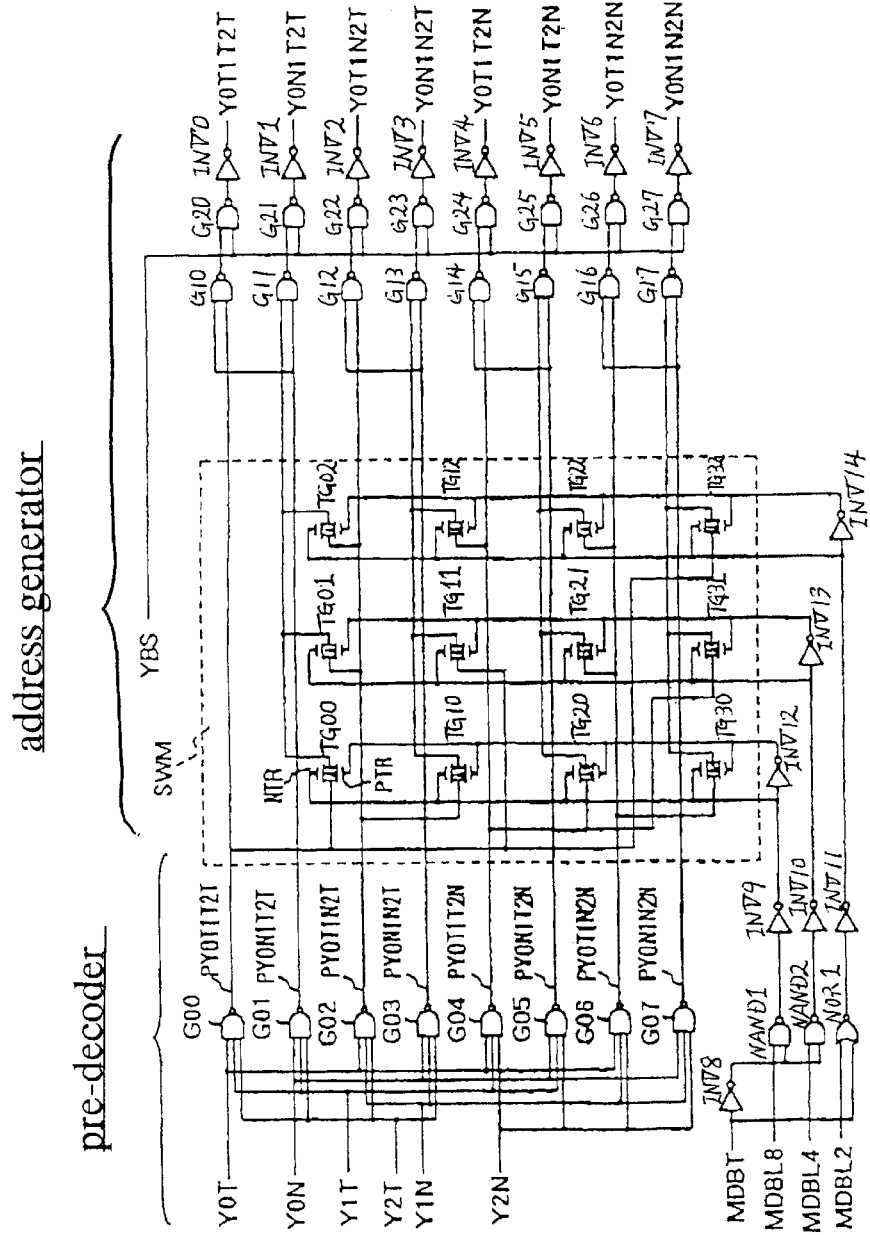
FIG. 9 is a circuit diagram illustrative of an available circuit configuration of the multi-bit pre-fetch address generator circuit in the synchronous dynamic random access memory with the burst access mode shown in FIG. 3.

The multi-bit pre-fetch address generator circuit 11 is operated to fetch address signals from the address latches 19 and generate a plurality of internal address signals on the basis of the fetched address signals, wherein the generated internal address signals are to be processed concurrently in the memory device. FIG. 9 is a circuit diagram illustrative of an available circuit configuration of the multi-bit pre-fetch address generator circuit 11 in the synchronous dynamic random access memory with the burst access mode shown in FIG. 3. The multi-bit pre-fetch address generator circuit 11 has a pre-decoding function.

The multi-bit pre-fetch address generator circuit 11 comprises a pre-decoder section and a multi-bit pre-fetch address generator section. The pre-decoder section has a first alignment of eight NAND gates G00, G01, G02, G03, G04, G05, G06 and G07. The multi-bit pre-fetch address generator section has a matrix arrays of transmission gates TG00, TG01, TG02, TG01, TG11, TG12, TG20, T021, T022, TG30, TG31, and TG32, and a second alignment of eight NAND gates G10, G11, G12, G13, G14, G15, G16 and G17, and a third alignment of eight NAND gates G20, G21, G22, G23, G24, G25, G26 and G27, and an alignment of eight inverters INV0, INV1, INV2, INV3, INV4, INV5, INV6, and INV7, as well as a logic gate circuit for generating controls signals to the above transmission gates. The logic gate circuit has seven inverters INV8, INV9, INV10, INV11, INV12, INV13 and INV14, two NAND gates NAND1 and NAND2 and a single NOR gate NOR1. Six input signals Y0T, T0N, Y1T, Y2T, Y1N and Y2N are inputted into the pre-decoder section. The NAND gate G00 receives input signals Y0T, Y1T and Y2T to generate a decoded output signal PY0T1T2T. The NAND gate G01 receives input signals Y0N, Y1T and Y2T to generate a decoded output signal PY0N1T2T. The NAND gate G02 receives input signals Y0T, Y1N and Y2T to generate a decoded output signal PY0T1N2T. The NAND gate G03 receives input signals Y0N, Y1N and Y2T to generate a decoded output signal PY0N1N2T. The NAND gate G04 receives input signals Y0T, Y1N and Y2T to generate a decoded output signal PY0N1N2N. The NAND gate G05 receives input signals Y0N, Y1T and Y2N to generate a decoded output signal PY0N1T2N. The NAND gate G06 receives input signals Y0T, Y1N and Y2N to generate a decoded output signal PY0N1T2N. The NAND gate G07 receives input signals Y0N, Y1N and Y2N to generate a decoded output signal PY0N1N2N.

The NAND gate G10 has a first input connected to an output of the NAND gate G00 to receive the pre-decoded signal PY0T1T2T and a second input connected to an output of the NAND gate G01 to receive the pre-decoded signal PY0N1T2T. The NAND gate G11 has a first input connected to outputs of the transmission gates TG00, TG01, TG02 and a second input connected to the output of the NAND gate G01 to receive the pre-decoded signal PY0N1T2T. The NAND gate G12 has a first input connected to an output of the NAND gate G02 to receive the pre-decoded signal PY0T1N2T and a second input connected to an output of the NAND gate G03 to receive the pre-decoded signal PY0N1N2T. The NAND gate G13 has a first input connected to outputs of the transmission gates TG10, TG11, TG12 and a second input connected to the output of the NAND gate G03 to receive the pre-decoded signal PY0N1N2T. The NAND gate G14 has a first input connected to an output of the NAND gate G04 to receive the pre-decoded signal PY0T1T2N and a second input connected to an output of the NAND gate G05 to receive the pre-decoded signal PY0N1T2N. The NAND gate G15 has a first input connected to outputs of the transmission gates TG20, TG21, TG22 and a second input connected to the output of the NAND gate G05 to receive the pre-decoded signal PY0N1T2N. The NAND gate G16 has a first input connected to an output of the NAND gate G06 to receive the pre-decoded signal PY0T1N2N and a second input connected to an output of the NAND gate G07 to receive the pre-decoded signal PY0N1N2N. The NAND gate G17 has a first input connected to outputs of the transmission gates TG30, TG31, TG32 and a second input connected to the output of the NAND gate G07 to receive the pre-decoded signal PY0N1N2N. The NAND gate G20 has a first input receiving a signal YBS and a second input connected to an output of the NAND gate G10 for receiving an output signal form the NAND gate G10. The NAND gate G21 has a first input receiving the signal YBS and a second input connected to an output of the NAND gate G11 for receiving an output signal form the NAND gate G11. The NAND gate G22 has a first input receiving the signal YBS and a second input connected to an output of the NAND gate G12 for receiving an output signal form the NAND gate G12. The NAND gate G23 has a first input receiving the signal YBS and a second input connected to an output of the NAND gate G13 for receiving an output signal form the NAND gate G13. The NAND gate G24 has a first input receiving the signal YBS and a second input connected to an output of the NAND gate G14 for receiving an output signal form the NAND gate G14. The NAND gate G25 has a first input receiving the signal YBS and a second input connected to an output of the NAND gate G15 for receiving an output signal form the NAND gate G15. The NAND gate G26 has a first input receiving the signal YBS and a second input connected to an output of the NAND gate G16 for receiving an output signal form the NAND gate G16. The NAND gate G27 has a first input receiving the signal YBS and a second input connected to an output of the NAND gate G17 for receiving an output signal form the NAND gate G17. The inverter INV0 has an input connected to an output of the NAND gate G20 for receiving an output from the NAND gate G20 to generate an output signal Y0T1T2T. The inverter INV1 has an input connected to an output of the NAND gate G21 for receiving an output from the NAND gate G21 to generate an output signal Y0N1T2T. The inverter INV2 has an input connected to an output of the NAND gate G22 for receiving an output from the NAND gate G22 to generate an output signal Y0T1N2T. The inverter INV3 has an input connected to an output of the NAND gate G23 for receiving an output from the NAND gate G23 to generate an output signal Y0N1N2T. The inverter INV4 has an input connected to an output of the NAND gate G24 for receiving an output from the NAND gate G24 to generate an output signal Y0T1T2N. The inverter INV5 has an input connected to an output of the NAND gate G25 for receiving an output from the NAND gate G25 to generate an output signal Y0N1T2N. The inverter INV6 has an input connected to an output of the NAND gate G26 for receiving an output from the NAND gate G26 to generate an output signal Y0T1N2N. The inverter INV7 has an input connected to an output of the NAND gate G27 for receiving an output from the NAND gate G27 to generate an output signal Y0N1N2N.

The detailed circuit interconnections between the above logic gates are as shown in FIG. 9.

Figure 10:
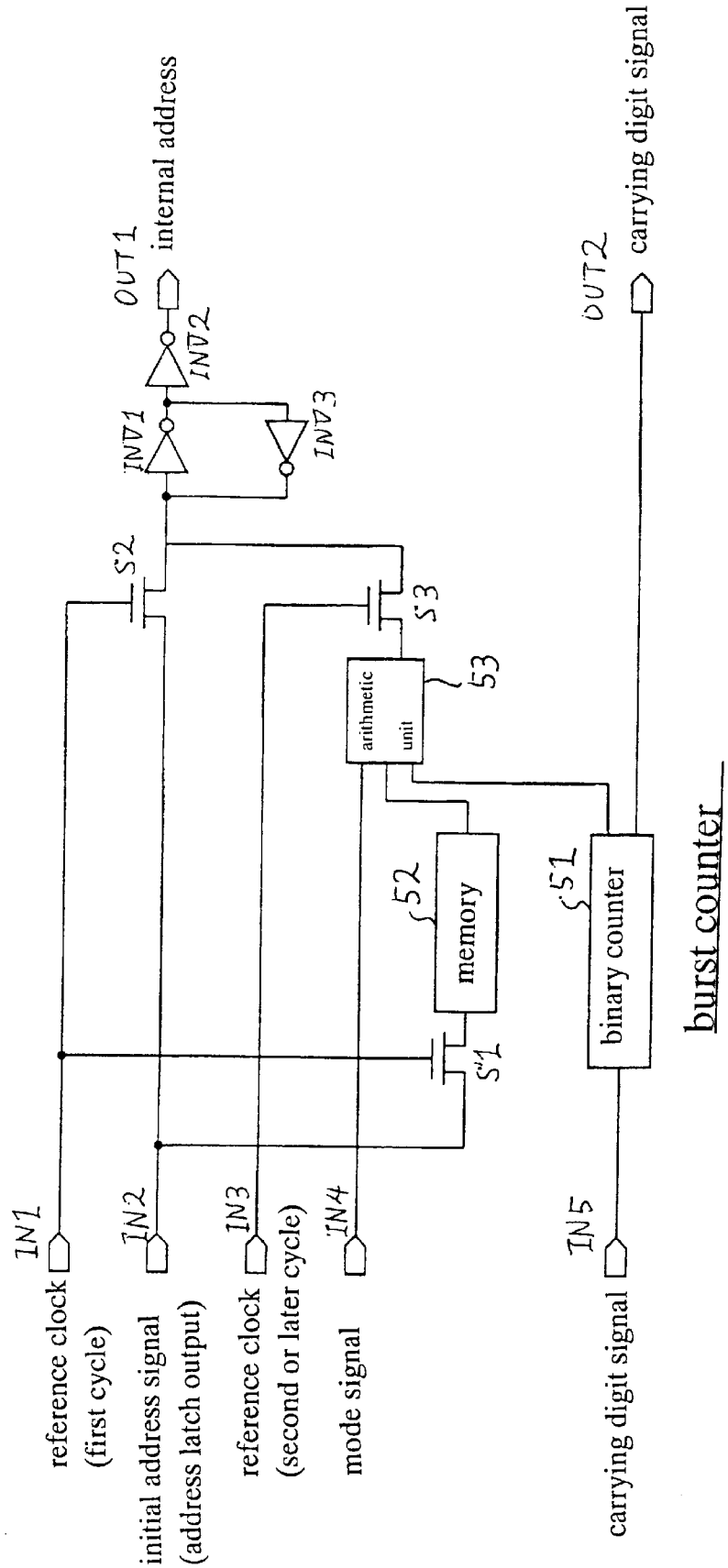
FIG. 10 is a block diagram illustrative of an available circuit configuration of each of the burst counters in the synchronous dynamic random access memory with the burst access mode shown in FIG. 3.

Each of the burst counters 12 and 13 is operated to receive an input of a read/write command signal from the command decoder 10 so that each of the burst counters 12 and 13 fetches the internal address signal from the multi-bit pre-fetch address generator circuit 11 and transmits the internal address signal to the corresponding one of the internal address driver circuits 14 and 15. FIG. 10 is a block diagram of each of the burst counters 12 and 13. The burst counter for one bit is shown in FIG. 10 and will be described hereinafter. The burst counter has five input terminals IN1, IN2, IN3, IN4 and IN5 and two output terminals OUT1 and OUT2. The first input terminal IN1 is provided to receive a reference clock signal in the first cycle. The second input terminal IN2 is provided to receive an initial address signal as the address latch output. The third input terminal IN3 is provided to receive a reference clock signal in the second or later cycle. The fourth input terminal IN4 is provided to receive a mode signal. The fourth input terminal IN4 is provided to receive a digit carrying signal for carrying the digit. The burst counter comprises three switching transistors S1, S2, and S3 and a logic circuit comprising three inverters INV1, INV2 and INV3 as well as a binary counter 51, an initial value memory 52 and an arithmetic unit 53. The first switching transistor S1 is connected in series between the second input terminal IN2 and an input side of the initial value memory 52. A gate of the first switching transistor S1 is connected to the first input terminal IN1. The second switching transistor S2 is connected in series between the second input terminal IN2 and an input side of the logic circuit comprising the three inverters INV1, INV2, and INV3. A gate of the second switching transistor S2 is connected to the first input terminal IN1. The third switching transistor S3 is connected in series between an output side of the arithmetic unit 53 and the input side of the logic circuit comprising the three inverters INV1, INV2, and INV3. A gate of the third switching transistor S3 is connected to the third input terminal IN3. The arithmetic unit 53 has a first input terminal connected to the forth input terminal IN4 receiving the mode signal, a second input terminal connected to an output side of the initial value memory 52 and a third input terminal connected to connected to a first output of the binary counter 51. The arithmetic unit 53 has an output terminal connected through the third switching transistor S3 to the logic circuit. The binary counter 51 has an input terminal connected to the fifth input terminal IN5 for receiving the digit carrying signal. The binary counter 51 has the first output terminal connected to the third input terminal of the arithmetic unit 53 and a second output terminal connected to the second output terminal OUT2 so as to transmit the digit carrying signal to the second output terminal OUT2. The logic circuit comprises the three inverters INV1, INV2 and INV3. The inverter INV1 has an input side connected the input side of the logic circuit, namely connected through the second switching transistor S2 to the second input terminal IN2 and also connected through the third switching transistor S3 to the output side of the arithmetic unit 53. The inverter INV1 has an output side connected to an input side of the inverter INV2. The inverter INV2 has an output side connected to the first output terminal OUT1. The inverter INV3 has an input side connected to the input side of the inverter INV2 and also connected to the output side of the inverter INV1. The inverter INV3 has an output side connected to the input side of the inverter INV1. An internal address signal appears on the first output terminal OUT1.

The internal address signals are transmitted from the burst counters 12 and 13 to the internal address driver circuits 14 and 15. The memory cell arrays 16 and 17 are connected to the internal address driver circuits 14 and 15 respectively so that data input/output operations to the memory cell arrays 16 and 17 are accomplished separately on the basis of the individual internal address signals from the internal address driver circuits 14 and 15. Thereafter, during a time period corresponding to the predetermined number of cycles, the individual burst counters 12 and 13 are continuously operated to generate new internal address signals individually so that data input/output operations to the individual memory cell arrays are continuously accomplished.

Figure 4:
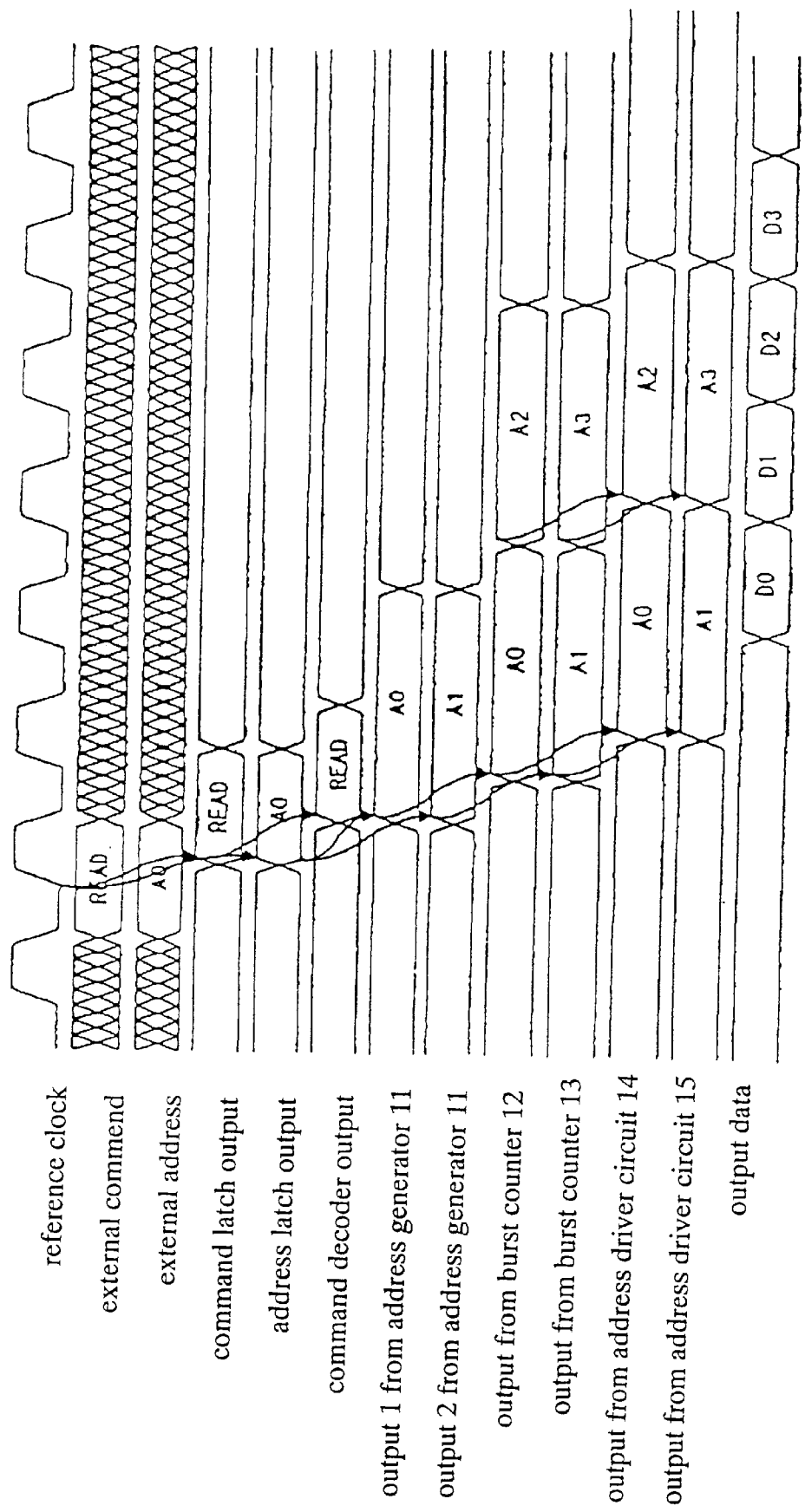
FIG. 4 is a timing chart illustrative of waveforms of individual signals transmitted between individual circuit elements of the memory device shown in FIG. 3.

The following descriptions will focus on the operations of the memory device described above with reference to FIGS. 3 and 4. FIG. 4 is a timing chart illustrative of waveforms of individual signals transmitted between individual circuit elements of the memory device shown in FIG. 3, wherein the number of pre-fetch is 2 and the burst length is 4.

Upon giving an address signal A0, the address latch 19 latches the address signal A0 and then the address signal A0 is transmitted to the multi-bit pre-fetch address generator circuit 11. The multi-bit pre-fetch address generator circuit 11 fetches the address signal A0 and then generates an address signal A1 on the basis of the fetched address signal A0 independently from the fact that whether or not the read/write command signal is outputted from the command decoder 10. The multi-bit prefetch address generator circuit 11 transmits the received address signal A0 to the burst counter 12 and also transmits the generated address signal A1 to the burst counter 13.

Upon giving an external command signal for reading operation, the command latch 18 fetches this command signal to transmit the fetched command signal into the command decoder 10. The command decoder 10 fetches the command signal and then decodes the command signal to generate a read command signal. This read command signal is transmitted from he command decoder 10 to the burst counters 12 and 13 respectively. Upon receipt of the read command signal by the burst counter 12, the burst counter 12 is operated to fetch the above address signal A0, so that the fetched address signal is then transmitted through the internal address driver circuit 14 to the memory cell array 16. Upon receipt of the read command signal by the burst counter 13, the burst counter 13 is operated to fetch the above address signal A1, so that the fetched address signal A1 is then transmitted through the internal address driver circuit 15 to the memory cell array 17.

Thereafter, the burst counter 12 generates an address signal A2 on the basis of the address signal A0 and a previously and internally set burst length, whilst the burst counter 13 generates an address signal A3 on the basis of the address signal A1 and a previously and internally set burst length. The address signal A2 is then transmitted through the internal address driver circuit 14 to the memory cell array 16, whilst the address signal A3 is then transmitted through the internal address driver circuit 15 to the memory cell array 17.

The address signals A0, A1, A2 and A3 are continuously transmitted to the memory cell arrays 16 and 17, so that output data D0, D1, D2 and D3 from the memory cell arrays 16 and 17 are obtained.

In the above circuit configuration, the output terminal of the command decoder 10 is connected to the plural burst counters 12 and 13 connected between input sides of the plural internal address driver circuits 14 and 15 and the output side of the multi-bit pre-fetch address generator circuit 11, so as to allow the multi-bit pre-fetch address generator circuit 11 to previously generate a plurality of internal address signals to be used for multi-bit pre-fetch operations, however, independently from whether or not a read/write command transmitted from the command decoder 10 is inputted, and also so as to allow the access path to be independent from the multi-bit pre-fetch address generator circuit 11, whereby the data read/write operation speed is improved. In this embodiment, the access path comprises the command latches 18, the command decoder 10, the burst counters 12 and 13, the internal address driver circuits 14 and 15 and the memory cell arrays 16 and 17.

In the above description, the above multi-bit pre-fetch address generator circuit 11 performs parallel process to 2-bits. Needless to say, it is possible apply the above multi-bit pre-fetch address generator circuit 11 to 4-bits pre-fetch operation, 8-bits pre-fetch operation, 16-bits pre-fetch operation, 32-bits pre-fetch operation.

The above descriptions has been made by taking the synchronous dynamic random access memory as one example. Nevertheless, the above description about the present invention is of course applicable to any other synchronous semiconductor memory devices.

Figure 5:
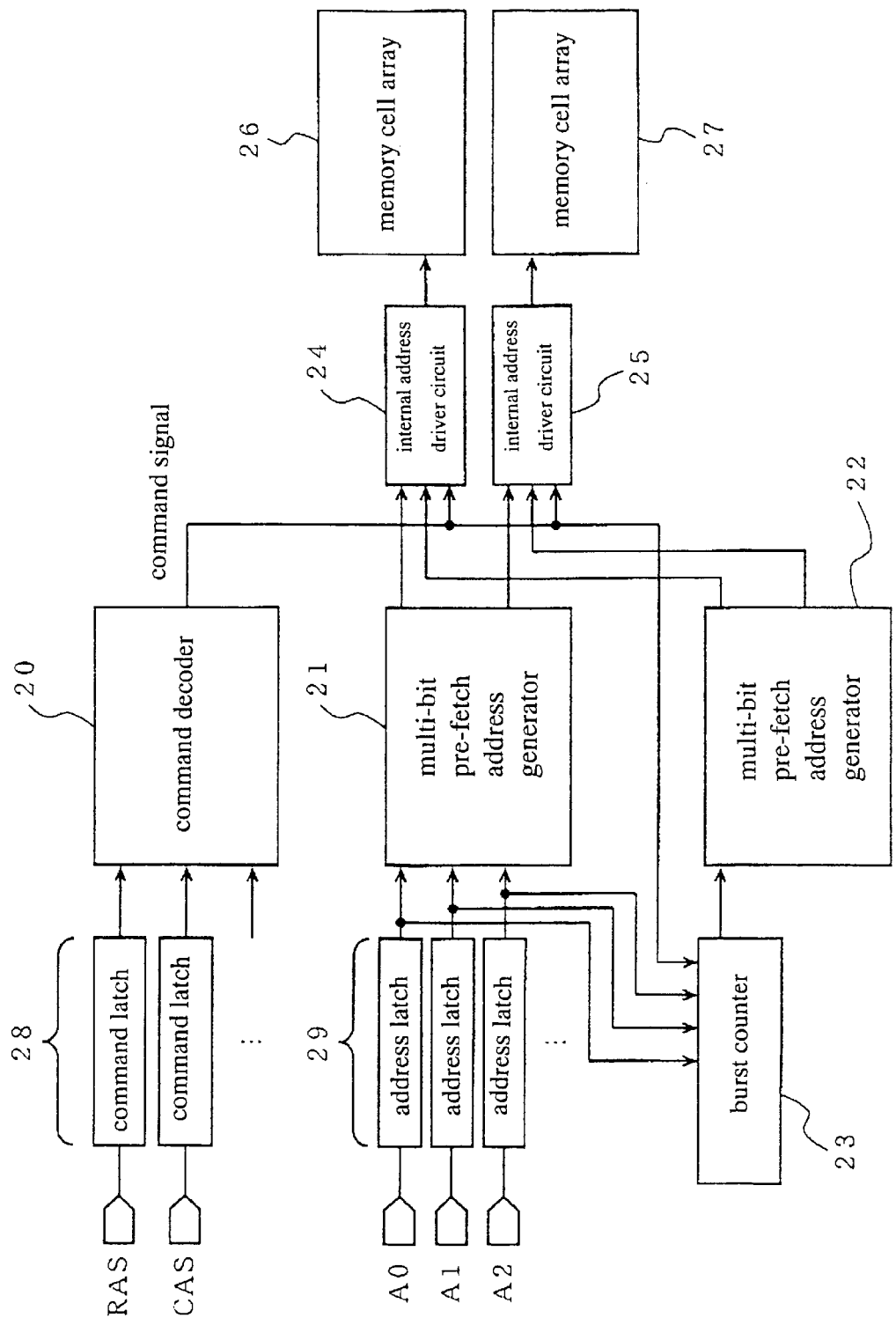
FIG. 5 is a block diagram illustrative of a second novel circuit configuration of a novel synchronous dynamic random access memory in a second embodiment in accordance with the present invention.

A second embodiment according to the present invention will be described in detail with reference to the drawings. FIG. 5 is a block diagram illustrative of a second novel circuit configuration of a novel synchronous dynamic random access memory in a second embodiment in accordance with the present invention. The synchronous dynamic random access memory has a plurality of command latches 28, a plurality of address latches 29, a command decoder 20 connected to the command latches 28, a first multi-bit pre-fetch address generator circuit 21 connected to the address latches 29, a single burst counter 23 connected to the address latches 29 and also connected to the commend decoder 20, a second multi-bit pre-fetch address generator circuit 22 connected to the burst counter 23, a plurality of internal address driver circuits 24 and 25, each of which is connected to the single burst counter 23 and also connected to the command decoder 20 as well as connected to the first and second multi-bit pre-fetch address generator circuits 21 and 22, and memory cell arrays 26 and 27 connected to the internal address driver circuits 24 and 25 respectively.

In this second embodiment, the circuit configuration is modified to reduce the number of the burst counter which has a larger number of circuit elements and also has a larger occupying area. In the above first embodiment, two of the burst counter are used, whilst in this second embodiment, only one of the burst counter is used in order to reduce the occupied area of the synchronous dynamic random access memory device. In place of the reduction in the number of the burst counter, two multi-bit pre-fetch address generator circuits are used. Since, however, each of the first and second multi-bit pre-fetch address generators has a more simple circuit configuration and a smaller occupied area than the burst counter, the occupied area of the second novel synchronous dynamic random access memory device of this second embodiment is smaller than the above first novel synchronous dynamic random access memory device of the first embodiment.

The command latches 28 are operated to latch external command signals RAS, CAS. The address latches 29 are operated to latch external address signals A0, A1 and A2. The command latches 28 and the address latches 29 may comprise latch circuits having the same circuit configuration as the command latches 18 and the address latches 19 used in the first embodiment and shown in FIG. 7. Namely, the latch circuit has two input terminals IN1 and IN2 and a single output terminal OUT. The first input terminal IN1 is provided to receive an input of a reference clock signal. The second input terminal IN2 is provided to receive an input of an external address signal if this latch circuit is used as the address latch 29, or to receive an input of an external command signal if this latch circuit is used as the command latch 28. The latch circuit comprises five inverters INV1, INV2, INV3, INV4 and INV5 and four transmission gates TG1, RG2, TG3 and TG4. The first inverter INV1 is provided which has an input side connected to the first input terminal IN1 receiving the reference clock signal. The first transmission gate TG1 is provided which has a first gate terminal connected to an output side of the first inverter INV1 and a second gate terminal connected to the input side of the first inverter INV1. The first transmission gate TG1 also has an input side connected to the second input terminal IN2 receiving the external address signal or the external command signal, and an output side connected to an input side of the second inverter INV2. The second transmission gate TG2 is provided which has a first gate terminal connected to the input side of the first inverter INV1 and a second gate terminal connected to the output side of the first inverter INV1. The second transmission gate TG2 also has an input side connected to an output side of the third inverter INV3, and an output side connected to the input side of the second inverter INV2. The third transmission gate TG3 is provided which has a first gate terminal connected to the input side of the first inverter INV1 and a second gate terminal connected to the output side of the first inverter INV1. The third transmission gate TG3 also has an input side connected to an output side of the second inverter INV2 and also connected to the input side of the third inverter INV3, and an output side connected to an input side of the fourth inverter INV4. The fourth transmission gate TG4 is provided which has a first gate terminal connected to the output side of the first inverter INV1 and a second gate terminal connected to the input side of the first inverter INV1. The fourth transmission gate TG4 also has an input side connected to an output side of the fifth inverter INV5, and an output side connected to the input side of the fourth inverter INV4 and also connected to the output side of the third transmission gate TG3. The fourth inverter INV4 has an input side connected to the output sides of the third and fourth transmission gates TG3 and TG4, and an output side connected to the output terminal OUT of the latch circuit. The fifth inverter INV5 has an input side connected to the output terminal OUT of the latch circuit, and an output side connected to the input sides of the fourth transmission gate TG4. The first transmission gate TG1 receives the reference clock signal as the second gate control signal and the inverted reference clock signal as the first gate control signal. The second transmission gate TG2 receives the reference clock signal as the first gate control signal and the inverted reference clock signal as the second gate control signal. The third transmission gate TG3 receives the reference clock signal as the first gate control signal and the inverted reference clock signal as the second gate control signal. The fourth transmission gate TG4 receives the reference clock signal as the second gate control signal and the inverted reference clock signal as the first gate control signal. The external address signal or the external command signal as inputted into the second input terminal IN2 of the latch circuit is transmitted through the first transmission gate TG1, the second inverter INV2, the third transmission gate TG3 and the fourth inverter INV4 to the output terminal OUT of the latch circuit.

The command decoder 20 is operated to fetch external command signals RAS, CAS in synchronizing with the reference clock signal in order to decode the external command signals RAS, CAS and to generate internal command signals respectively corresponding to the external command signals. The command decoder 20 may have the same circuit configuration as the above command decoder 10 used in the first embodiment and shown in FIG. 8. Namely, the decoder circuit 20 has two input terminals IN1 and IN2 and a single output terminal OUT. The first input terminal IN1 is provided to receive an input of a reference clock signal. The second input terminals IN2 are connected to the plural command latch circuits 18 or receiving command latch outputs from the plural command latch circuits 28. The decoder circuit comprises five inverters INV1, INV2, INV3, 1NV4 and INV5 and four transmission gates TG1, RG2, TG3 and TG4, and further a single delay circuit DELAY and a single AND gate AND1. The delay circuit is provided which has an input side connected to the first input terminal IN1 of the decoder circuit for receiving the reference clock signal. The AND gate is provided which has input terminals respectively connected to the second input terminals IN2 receiving the command latch outputs from the command latch circuits 28. The first inverter INV1 is provided which has an input side connected to an output side of the delay circuit DELAY for receiving the delayed reference clock signal from the delay circuit DELAY. The first transmission gate TG1 is provided which has a first gate terminal connected to an output side of the first inverter INV1 and a second gate terminal connected to the input side of the first inverter INV1. The first transmission gate TG1 also has an input side connected to an output terminal of the AND gate AND1 from an AND signal from the AND gate AND1, and an output side connected to an input side of the second inverter INV2. The second transmission gate TG2 is provided which has a first gate terminal connected to the input side of the first inverter INV1 and a second gate terminal connected to the output side of the first inverter INV1. The second transmission gate TG2 also has an input side connected to an output side of the third inverter INV3, and an output side connected to the input side of the second inverter INV2. The third transmission gate TG3 is provided which has a first gate terminal connected to the input side of the first inverter INV1 and a second gate terminal connected to the output side of the first inverter INV1. The third transmission gate TG3 also has an input side connected to an output side of the second inverter INV2 and also connected to the input side of the third inverter INV3, and an output side connected to an input side of the fourth inverter INV4. The fourth transmission gate TG4 is provided which has a first gate terminal connected to the output side of the first inverter INV1 and a second gate terminal connected to the input side of the first inverter INV1. The fourth transmission gate TG4 also has an input side connected to an output side of the fifth inverter INV5, and an output side connected to the input side of the fourth inverter INV4 and also connected to the output side of the third transmission gate TG3. The fourth inverter INV4 has an input side connected to the output sides of the third and fourth transmission gates TG3 and TG4, and an output side connected to the output terminal OUT of the decoder circuit. The fifth inverter INV5 has an input side connected to the output terminal OUT of the decoder circuit, and an output side connected to the input sides of the fourth transmission gate TG4. The first transmission gate TG1 receives the delay reference clock signal as the second gate control signal and the inverted delay reference clock signal as the first gate control signal. The second transmission gate TG2 receives the delay reference clock signal as the first gate control signal and the inverted delay reference clock signal as the second gate control signal. The third transmission gate TG3 receives the delay reference clock signal as the first gate control signal and the inverted delay reference clock signal as the second gate control signal. The fourth transmission gate TG4 receives the delay reference clock signal as the second gate control signal and the inverted delay reference clock signal as the first gate control signal. The logical product of the command latch outputs is transmitted through the first transmission gate TG1, the second inverter INV2, the third transmission gate TG3 and the fourth inverter INV4 to the output terminal OUT of the decoder circuit.

The first multi-bit pre-fetch address generator circuit 21 is operated to fetch address signals from the address latches 29 and generate a plurality of first internal address signals on the basis of the fetched address signals, wherein the generated first internal address signals are to be processed concurrently in the memory device. The first multi-bit pre-fetch address generator circuit 21 may have the same circuit configuration as the above described multi-bit pre-fetch address generator circuit 11 used in the first embodiment and shown in FIG. 9. The first multi-bit pre-fetch address generator circuit 21 has a pre-decoding function. The first multi-bit pre-fetch address generator circuit 21 generates a plurality of first internal address signals which are to be transmitted to the internal address driver circuits 24 and 25. The generated first internal address signals are then transmitted from the first multi-bit pre-fetch address generator circuit 21 through the internal address driver circuits 24 and 25 to the memory cell arrays 26 and 27 so that the data read/write operations to the memory cell arrays 26 and 27 are accomplished.

The single burst counter 23 is operated to receive internally inputted address signals from the address latches 29 and also receive an input of a read/write command signal from the command decoder 20, so that, during the data read/write operations to the memory cell arrays 26 and 27 on the basis of the first internal address signals generated by the first multi-bit pre-fetch address generator circuit 21, the single burst counter 23 is operated to generate a plurality of new internal address signals on the basis of the above received address signals and the previously set burst length and transmits the internal address signals to the second multi-bit pre-fetch address generator circuit 22. The burst counter 23 may has the same circuit configuration as each of the above described burst counters 12 and 13 used in the first embodiment and shown in FIG. 10. Namely, the burst counter 23 has five input terminals IN1, IN2, IN3, IN4 and IN5 and two output terminals OUT1 and OUT2. The first input terminal IN1 is provided to receive a reference clock signal in the first cycle. The second input terminal IN2 is provided to receive an initial address signal as the address latch output. The third input terminal IN3 is provided to receive a reference clock signal in the second or later cycle. The fourth input terminal IN4 is provided to receive a mode signal. The fourth input terminal IN4 is provided to receive a digit carrying signal for carrying the digit. The burst counter comprises three switching transistors S1, S2, and S3 and a logic circuit comprising three inverters INV1, INV2 and INV3 as well as a binary counter 51, an initial value memory 52 and an arithmetic unit 53. The first switching transistor S1 is connected in series between the second input terminal IN2 and an input side of the initial value memory 52. A gate of the first switching transistor S1 is connected to the first input terminal IN1. The second switching transistor S2 is connected in series between the second input terminal IN2 and an input side of the logic circuit comprising the three inverters INV1, INV2, and INV3. A gate of the second switching transistor S2 is connected to the first input terminal IN1. The third switching transistor S3 is connected in series between an output side of the arithmetic unit 53 and the input side of the logic circuit comprising the three inverters INV1, INV2, and INV3. A gate of the third switching transistor S3 is connected to the third input terminal IN3. The arithmetic unit 53 has a first input terminal connected to the forth input terminal IN4 receiving the mode signal, a second input terminal connected to an output side of the initial value memory 52 and a third input terminal connected to connected to a first output of the binary counter 51. The arithmetic unit 53 has an output terminal connected through the third switching transistor S3 to the logic circuit. The binary counter 51 has an input terminal connected to the fifth input terminal INS for receiving the digit carrying signal. The binary counter 51 has the first output terminal connected to the third input terminal of the arithmetic unit 53 and a second output terminal connected to the second output terminal OUT2 so as to transmit the digit carrying signal to the second output terminal OUT2. The logic circuit comprises the three inverters INV1, INV2 and INV3. The inverter INV1 has an input side connected the input side of the logic circuit, namely connected through the second switching transistor S2 to the second input terminal IN2 and also connected through the third switching transistor S3 to the output side of the arithmetic unit 53. The inverter INV1 has an output side connected to an input side of the inverter INV2. The inverter INV2 has an output side connected to the first output terminal OUT1. The inverter INV3 has an input side connected to the input side of the inverter INV2 and also connected to the output side of the inverter INV1. The inverter INV3 has an output side connected to the input side of the inverter INV1. An internal address signal appears on the first output terminal OUT1.

The second multi-bit pre-fetch address generator circuit 22 is operated to fetch the address signals from the single burst counter 23 and generate a plurality of second internal address signals on the basis of the fetched address signals, wherein the generated second internal address signals are to be processed concurrently in the memory device. The second multi-bit pre-fetch address generator circuit 22 may have the same circuit configuration as the above described multi-bit pre-fetch address generator circuit 11 used in the first embodiment and shown in FIG. 9. The second multi-bit pre-fetch address generator circuit 22 has a pre-decoding function. The second multi-bit pre-fetch address generator circuit 22 generates a plurality of second internal address signals which are to be transmitted to the internal address driver circuits 24 and 25. The generated second internal address signals are then transmitted from the second multi-bit pre-fetch address generator circuit 22 through the internal address driver circuits 24 and 25 to the memory cell arrays 26 and 27 so that the data read/write operations to the memory cell arrays 26 and 27 are accomplished.

The first and second internal address signals are transmitted from the first and second multi-bit pre-fetch address generator circuits 21 and 22 to the internal address driver circuits 24 and 25. The memory cell arrays 26 and 27 are connected to the internal address driver circuits 24 and 25 respectively so that data input/output operations to the memory cell arrays 26 and 27 arc accomplished separately on the basis of the individual internal address signals from the internal address driver circuits 24 and 25.

Namely, during when the internal address signals generated by the first multi-bit pre-fetch address generator circuit 21 are transmitted through the internal address driver circuits 24 and 25 to the memory cell arrays 26 and 27, the single burst counter 23 is operated to generate the new internal address signal upon receipt of the read/write commend signal from the command decoder 20, so that data input/output operations to the individual memory cell arrays are continuously accomplished.

Figure 6:
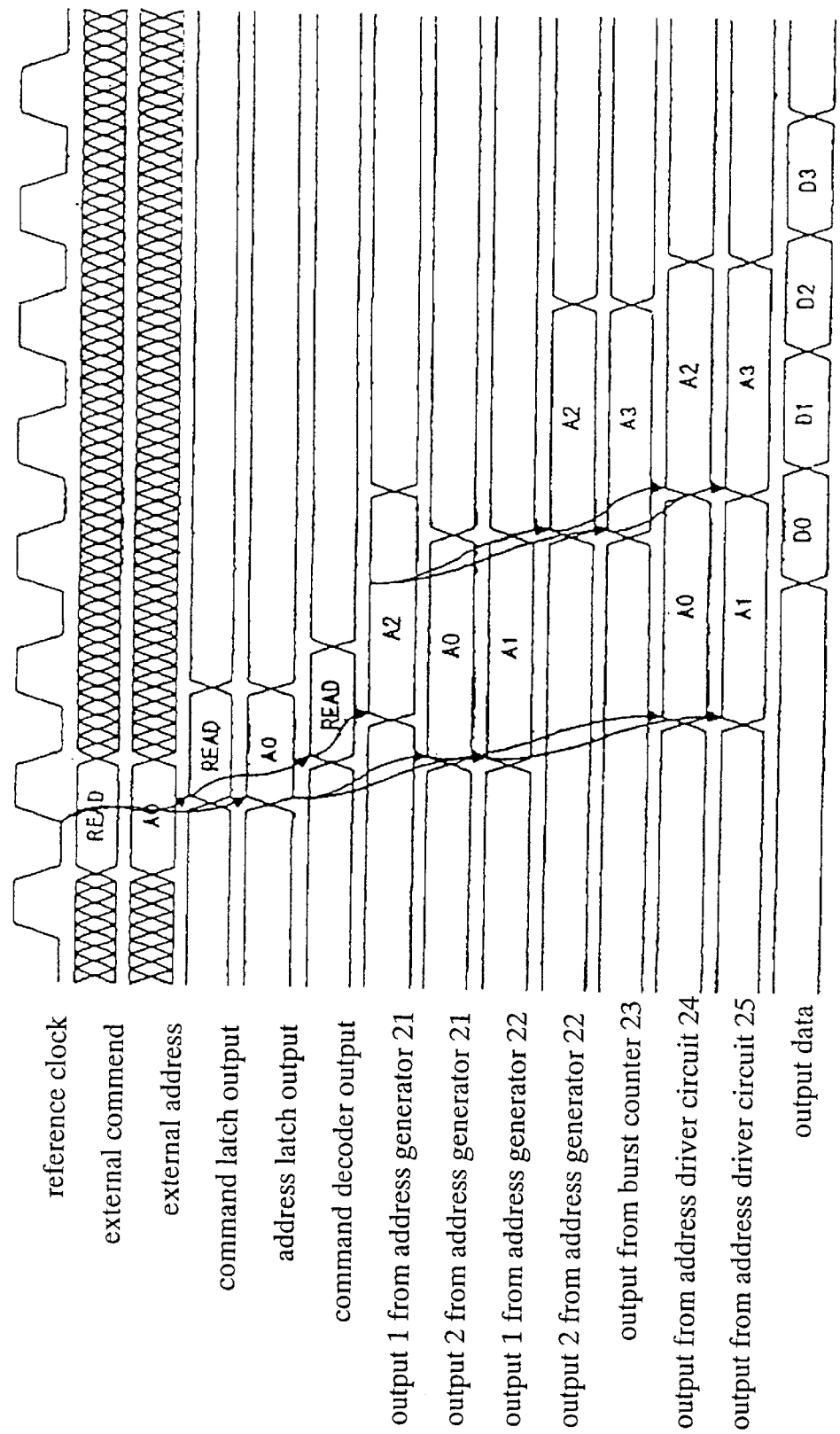
FIG. 6 is a timing chart illustrative of waveforms of individual signals transmitted between individual circuit elements of the memory device shown in FIG. 5.

The following descriptions will focus on the operations of the memory device described above with reference to FIGS. 5 and 6. FIG. 6 is a timing chart illustrative of waveforms of individual signals transmitted between individual circuit elements of the memory device shown in FIG. 5, wherein the number of pre-fetch is 2 and the burst length is 4.

Upon giving an address signal A0, the address latch 29 latches the address signal A0 and then the address signal A0 is transmitted to the first multi-bit pre-fetch address generator circuit 21. The first multi-bit pre-fetch address generator circuit 21 fetches the address signal A0 and then generates an address signal A1 on the basis of the fetched address signal A0 independently from the fact that whether or not the read/write command signal is outputted from the command decoder 20. The first multi-bit pre-fetch address generator circuit 21 transmits the received address signal A0 to the internal address driver circuit 24 and also transmits the generated address signal A1 to the internal address driver circuit 25.

Upon giving an external command signal for reading operation, the command latch 28 fetches this command signal to transmit the fetched command signal into the command decoder 20. The command decoder 20 fetches the command signal and then decodes the command signal to generate a read command signal. This read command signal is transmitted from he command decoder 20 to the burst counter 23 and the internal address driver circuits 24 and 25 respectively. Upon receipt of the read command signal by the internal address driver circuit 24, the internal address driver circuit 24 is operated to transmit the fetched address signal A0 to the memory cell array 26. Upon receipt of the read command signal by the internal address driver circuit 25, the internal address driver circuit 25 is operated to transmit the fetched address signal A1 to the memory cell array 26.

During when the internal address signals generated by the first multi-bit pre-fetch address generator circuit 21 are transmitted through the internal address driver circuits 24 and 25 to the memory cell arrays 26 and 27, the single burst counter 23 is operated to generate an internal address signal A2 upon receipt of the read/write commend signal from the command decoder 20, wherein this internal address signal A2 is generated on the basis of the address signal A0 and the previously set burst length, so that this internal address signal A2 is transmitted to the second multi-bit pre-fetch address generator circuit 22. The second multi-bit pre-fetch address generator circuit 22 fetches the address signal A2 and then generates an address signal A3 on the basis of the fetched address signal A2 independently from the fact that whether or not the read/write command signal is outputted from the command decoder 20. The second multi-bit pre-fetch address generator circuit 22 transmits the received address signal A2 to the internal address driver circuit 24 and also transmits the generated address signal A3 to the internal address driver circuit 25.

Thereafter, the internal address driver circuit 24 transmits the fetched internal address signals A0 and A2 to the memory cell array 26, whilst the internal address driver circuit 25 transmits the fetched internal address signals A1 and A3 to the memory cell array 27.

The address signals A0, A1, A2 and A3 are continuously transmitted to the memory cell arrays 26 and 27, so that output data D0, D1, D2 and D3 from the memory cell arrays 26 and 27 are obtained.

In the above circuit configuration, the output terminal of the command decoder 20 is connected to input sides of the plural internal address driver circuits 24 and 25 and also connected to the input side of the single burst counter 23, so as to allow the first multi-bit pre-fetch address generator circuit 21 to previously generate a plurality of first internal address signals to be used for multi-bit pre-fetch operations, however, independently from whether or not a read/write command transmitted from the command decoder 20 is inputted, and also so as to allow one of the two access paths to be independent from the first multi-bit pre-fetch address generator circuit 21, whereby the data read/write operation speed is improved. In this embodiment, the one access path comprises the command latches 28, the command decoder 20, the internal address driver circuits 24 and 25 and the memory cell arrays 26 and 27. The remaining access path includes the second multi-bit pre-fetch address generator circuit 22. As described above, however, during when the internal address signals generated by the first multi-bit pre-fetch address generator circuit 21 are transmitted through the internal address driver circuits 24 and 25 to the memory cell arrays 26 and 27, the single burst counter 23 generates the second internal address signal to transmit this generated internal address signal into the second multi-bit pre-fetch address generator circuit 22 whereby the second multi-bit pre-fetch address generator circuit 22 generates an address signal on the basis of the fetched address signal, for which reason inclusion of the second multi-bit pre-fetch address generator circuit 21 in the remaining access path does not disturb the improvement in data read/write operation speed of the above synchronous memory device.

In the above description, each of the above first and second multi-bit pre-fetch address generator circuits 21 and 22 performs parallel process to 2-bits. Needless to say, it is possible apply the above first and second multi-bit pre-fetch address generator circuit 21 and 22 to 4-bits pre-fetch operation, 8-bits pre-fetch operation, 16-bits pre-fetch operation, 32-bits pre-fetch operation.

The above descriptions has been made by taking the synchronous dynamic random access memory as one example. Nevertheless, the above description about the present invention is of course applicable to any other synchronous semiconductor memory devices.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A circuit connection structure of at least a multi-bit pre-fetch address generator circuit to at least an access path of a synchronous memory device, said at least an access path including at least a command decoder having an output terminal connected to at least a follower circuit element which receives a command signal from said at least a command decoder, wherein said at least a multi-bit pre-fetch address generator circuit is connected to said at least a follower circuit element in parallel to said at least a command decoder, so that said at least a multi-bit pre-fetch address generator circuit is excluded from a transmission path of said command signal, whereby said at least a multi-bit pre-fetch address generator circuit generates a plurality of internal address signals independently from transmission of said command signal from said at least a command decoder to said at least a follower circuit element.

2. The circuit connection structure as claimed in claim 1, wherein said at least a multi-bit pre-fetch address generator circuit comprises a single multi-bit pre-fetch address generator circuit, and said at least a follower circuit element comprises a plurality of burst counters.

3. The circuit connection structure as claimed in claim 2, wherein said at least an access path comprises a single access path which comprises:

command latch circuits;

a command decoder connected to said command latch circuits;

said plurality of burst counters respectively connected to said command decoder;

a plurality of internal address driver circuits individually connected to corresponding ones of said plurality of burst counters; and a plurality of memory cell arrays individually connected to corresponding ones of said plurality of internal address driver circuits, and wherein said single multi-bit pre-fetch address generator circuit is connected to said plurality of burst counters respectively.

4. The circuit connection structure as claimed in claim 1, wherein said at least a multi-bit pre-fetch address generator circuit comprises a plurality of multi-bit pre-fetch address generator circuits, and said at least an access path comprises a plurality of access paths, so that at least one of said plurality of multi-bit pre-fetch address generator circuits is excluded from at least one of said plurality of access paths, and the remaining of said plurality of multi-bit pre-fetch address generator circuits is included in the remaining of said plurality of access paths.

5. The circuit connection structure as claimed in claim 4, wherein said plurality of access paths comprise first and second access paths and said plurality of said multi-bit pre-fetch address generator circuits comprise first and second multi-bit pre-fetch address generator circuits, and said first access path comprises:

command latch circuits;

a command decoder connected to said command latch circuits;

a plurality of internal address driver circuits connected to said command decoder;

a plurality of memory cell arrays individually connected to corresponding ones of said plurality of internal address driver circuits, and wherein said second access path comprises:

said command latch circuits;

said command decoder connected to said command latch circuits;

a single burst counter connected to said command decoder and also connected to address latch circuits;

said second multi-bit pre-fetch address generator circuit connected to said single burst counter;

said plurality of internal address driver circuits connected to said second multi-bit pre-fetch address generator circuit;

said plurality of memory cell arrays individually connected to corresponding ones of said plurality of internal address driver circuits, and wherein said first multi-bit pre-fetch address generator circuit is connected to each of said plurality of internal address driver circuits.

6. A synchronous memory device having a circuit connection structure as claimed in claim 1.

7. A synchronous memory device having at least a multi-bit pre-fetch address generator circuit, and at least an access path which includes at least a command decoder having an output terminal connected to at least a follower circuit element which receives a command signal from said at least a command decoder, wherein said at least a multi-bit pre-fetch address generator circuit is connected to said at least a follower circuit element in parallel to said at least a command decoder, so that said at least a multi-bit pre-fetch address generator circuit is excluded from a transmission path of said command signal, whereby said at least a multi-bit pre-fetch address generator circuit generates a plurality of internal address signals independently from transmission of said command signal from said at least a command decoder to said at least a follower circuit element.

8. The synchronous memory device as claimed in claim 7, wherein said at least a multi-bit pre-fetch address generator circuit comprises a single multi-bit pre-fetch address generator circuit, and said at least a follower circuit element comprises a plurality of burst counters.

9. The synchronous memory device as claimed in claim 8, wherein said at least an access path comprises a single access path which comprises:

command latch circuits;

a command decoder connected to said command latch circuits;

said plurality of burst counters respectively connected to said command decoder;

a plurality of internal address driver circuits individually connected to corresponding ones of said plurality of burst counters; and a plurality of memory cell arrays individually connected to corresponding ones of said plurality of internal address driver circuits, and wherein said single multi-bit pre-fetch address generator circuit is connected to said plurality of burst counters respectively.

10. The synchronous memory device as claimed in claim 7, wherein said at least a multi-bit pre-fetch address generator circuit comprises a plurality of multi-bit pre-fetch address generator circuits, and said at least an access path comprises a plurality of access paths, so that at least one of said plurality of multi-bit pre-fetch address generator circuits is excluded from at least one of said plurality of access paths, and the remaining of said plurality of multi-bit pre-fetch address generator circuits is included in the remaining of said plurality of access paths.

11. The synchronous memory device as claimed in claim 10, wherein said plurality of access paths comprise first and second access paths and said plurality of said multi-bit pre-fetch address generator circuits comprise first and second multi-bit pre-fetch address generator circuits, and said first access path comprises:

command latch circuits;

a command decoder connected to said command latch circuits;

a plurality of internal address driver circuits connected to said command decoder;

a plurality of memory cell arrays individually connected to corresponding ones of said plurality of internal address driver circuits, and wherein said second access path comprises:
said command latch circuits;
said command decoder connected to said command latch circuits;
a single burst counter connected to said command decoder and also connected to address latch circuits;
said second multi-bit pre-fetch address generator circuit connected to said single burst counter;

said plurality of internal address driver circuits connected to said second multi-bit pre-fetch address generator circuit; and said plurality of memory cell arrays individually connected to corresponding ones of said plurality of internal address driver circuits, and wherein said first multi-bit pre-fetch address generator circuit is connected to each of said plurality of internal address driver circuits.

\* \* \* \* \*